United States Patent
Koenig

(10) Patent No.: US 7,302,241 B2
(45) Date of Patent: Nov. 27, 2007

(54) WIRELESS RECEIVER WITHOUT AGC

(75) Inventor: Matthias Koenig, Taunnusstein (DE)

(73) Assignee: Motorola, Inc., Schaumburg, IL (US)

( * ) Notice: Subject to any disclaimer, the term of this patent is extended or adjusted under 35 U.S.C. 154(b) by 52 days.

(21) Appl. No.: 10/501,108

(22) PCT Filed: Dec. 16, 2002

(86) PCT No.: PCT/EP02/14334

§ 371 (c)(1),
(2), (4) Date: Jul. 8, 2004

(87) PCT Pub. No.: WO03/058831

PCT Pub. Date: Jul. 17, 2003

(65) Prior Publication Data

US 2005/0079837 A1    Apr. 14, 2005

(30) Foreign Application Priority Data

Jan. 10, 2002   (GB) ................... 0200496.8

(51) Int. Cl.
*H04B 17/02* (2006.01)
(52) U.S. Cl. .............. 455/136; 455/138; 455/194.2
(58) Field of Classification Search ............ 455/136, 455/427, 134, 138, 183.2, 184.1, 192.3, 194.2, 455/220; 341/143
See application file for complete search history.

(56) References Cited

U.S. PATENT DOCUMENTS

| 3,311,894 | A | * | 3/1967 | Chudleigh, Jr. ............. 342/190 |
| 4,114,115 | A | * | 9/1978 | Minnis ........................ 333/14 |
| 4,887,299 | A | * | 12/1989 | Cummins et al. ........... 381/317 |
| 5,903,835 | A | * | 5/1999 | Dent .......................... 455/427 |
| 6,005,506 | A | * | 12/1999 | Bazarjani et al. ........... 341/143 |
| 6,069,923 | A | * | 5/2000 | Ostman et al. ............. 375/316 |
| 6,229,375 | B1 | | 5/2001 | Koen |

FOREIGN PATENT DOCUMENTS

WO    WO 96/08878    3/1996

* cited by examiner

*Primary Examiner*—Quochien B. Vuong
*Assistant Examiner*—Nguyen H. Nguyen
(74) *Attorney, Agent, or Firm*—Valerie M. Davis

(57) ABSTRACT

A wireless communication unit (300) incorporates a receiver comprising radio frequency circuitry (210, 220, 230, 240) for receiving a radio frequency signal and converting the radio frequency signal to a low frequency signal. A signal level adjustment circuit receives the low frequency signal and an analogue to digital converter (370), operably coupled to the signal level adjustment circuit receives an adjusted low frequency signal and providing a digital received signal. A signal processor (108) operably coupled to the analogue to digital converter (370) processes the digital received signal. The signal level adjustment circuit includes a low frequency amplifier (360) whose gain is arranged to be dependent upon a clip point of the analogue to digital converter (370).

13 Claims, 3 Drawing Sheets

WIRELESS RECEIVER WITHOUT AGC

This application claims the benefit of prior filed co-pending international application Ser. No. PCT/EP02/14334 filed Dec. 16, 2002, and assigned to Motorola, Inc., which was published by the International Bureau on Jul. 17, 2003 under No. WO 03/058831 A1 and Great Britain application Serial No. 0200496.8 filed Jan. 10, 2002.

FIELD OF THE INVENTION

This invention relates to radio receiver technology. The invention is applicable to, but not limited to, removing a need for automatic gain control in portable or mobile radio and/or cellular phone technology, whilst maintaining a high dynamic range.

BACKGROUND OF THE INVENTION

Wireless communications systems, for example cellular telephony or private mobile radio communications systems, typically provide for radio telecommunication links to be arranged between a plurality of base transceiver stations (BTSs) and a plurality of subscriber units, often termed mobile stations (MSs). The term mobile station generally includes both hand-portable and vehicular mounted radio units.

The communication link from a BTS to an MS is generally referred to as a downlink communication channel. Conversely, the communication link from an MS to a BTS is generally referred to as an up-link communication channel.

Wireless communication systems are distinguished over fixed communications systems, such as the public switched telephone networks (PSTN), principally in that mobile stations move between service providers (and/or different BTS) and in doing so encounter varying radio propagation environments.

In a wireless communication system, each BTS has associated with it a particular geographical coverage area (or cell). The coverage area defines a particular range over which the BTS can maintain acceptable communications with MSs operating in its serving cell. Often these cells combine to produce an expanded system coverage area, with the infrastructure supporting respective cells interconnected via centralised switching equipment.

The coverage area is typically determined by a receiver's ability to receive and decode very low-level signals from the transmitting unit. The range of signal levels that a receiver must be able to receive is termed the 'dynamic range' of a radio receiver.

For present day hand-portable or mobile receivers, such as those used in portable two-way radios and cellular phones, a larger dynamic range performance equates to less dropped calls and less cell-to-cell handovers. This further leads to a reduction in system overhead transmissions as well as a general improvement to the system's quality of service. Therefore, it is generally a desirable aim of a receiver designer to increase/improve a receiver's dynamic range.

However, a trade-off exists between dynamic range and current consumption in such receivers. Such a trade-off is particularly important iN the field of portable radio designs, where battery life and therefore power consumption is of critical importance. To obtain a higher dynamic range, the active stages of a receiver's radio frequency (RF) components must run at higher DC currents, thus lowering battery life during standby. Running at higher DC currents consequently causes a reduction in battery life.

One option to compensate for a reduction in battery life, in order to increase a dynamic range, would be to increase the battery capacity. However, such an option is rarely considered as viable in the portable cellular/radio field, as this would require an increase in both the size and the weight of the battery.

In summary, reducing standby time or increasing battery capacity are both highly undesirable for portable products, where low size and weight and long standby times are demanded in order for a product to be competitive in this market.

A radio receiver is often defined in terms of 'front-end' and 'back-end' characteristics. The front-end of a receiver encompasses all of the RF circuitry whereas the 'back-end' encompasses all of the base-band processing circuitry.

In the field of this invention, it is known that most receivers have automatic gain control (AGC), which controls the gain of the final stages of the receiver. Such AGC operation needs to be wide-band when some portion of the AGC circuitry is operational at RF frequencies, or narrow-band if the AGC circuitry is only operational at intermediate or baseband frequencies.

When used in receiver circuits, amplifiers will often encounter a very wide range of signal levels; typically they need to operate (namely be able to receive and recover signals) over a 120-dB range. To prevent overloading of these active components, the receiver's gain must be reduced as the signal strength increases. This is usually achieved automatically by changing the bias point of the RF transistor. However, in addition to the change in gain, the bias changes may also alter the input and output impedances of the receiver's front-end and thereby may make the amplifier operation more nonlinear.

Overall amplifier gain is generally dictated by the performance of two amplifier parameters. The first component is the power gain of the transistor itself and the second component is the loss of gain due to input and output mismatching.

A poor design might then start out with a high-gain mismatched stage. When the bias is changed in order to reduce the gain of the transistor, the input and output impedance matching needs to change in order to provide an improved transfer of power.

A better design would start out with ideal matching when highest gain is required and then benefit from both the mismatch and the transistor gain loss as bias is changed. Such a design would likely require neutralization at the highest gain setting.

It is known that the gain of a transistor is typically changed in one of two ways. A first method is to change the collector current or the collector-to-emitter voltage. Any current changes either above or below the optimum value result in a loss of gain. At lower current levels, the voltage has little effect on the gain, whilst at the higher current levels the collector voltage has a more noticeable effect. The two methods of automatic gain control will then depend on whether the collector current is either increased (forward control) or decreased (reverse control) from the optimum value.

The simplest method of gain control is obtained by reducing the collector current. This will simultaneously decrease the current gain and raise the input impedance. Both effects will decrease the power gain, and the increase in input impedance will result in a further mismatch loss.

In summary, it is known that the provision of stable, AGC circuits in radio products is problematic, complex and typically requires a substantial number of hardware (RF) components. In particular, AGC designs are critical to ensure stability of the RF operation, and to achieve rapid receiver operation, often-termed fast 'receiver attack times'. The costly hardware needs to be controlled from the base-band processing circuitry, in order to ensure accurate performance, which adds to the complexity of the AGC solution.

A need therefore exists for a high dynamic range radio receiver, particularly for linear technology such as that adopted for TETRA, wherein the above-mentioned disadvantages may be alleviated.

STATEMENT OF INVENTION

In accordance with a preferred embodiment of the present invention, there is provided a wireless communication unit incorporating a receiver, as claimed in claim 1. A method as claimed in claim 16 is also provided. Further aspects of the invention are as claimed in the dependent claims.

In summary, the preferred embodiment of the present invention proposes a receiver arrangement that uses a dynamic compressor function, in conjunction with a modified amplifier, to provide a high dynamic range receiver that precludes the need to use AGC circuits or components.

BRIEF DESCRIPTION OF THE DRAWINGS

Exemplary embodiments of the present invention will now be described, with reference to the accompanying drawings, in which.

DESCRIPTION OF PREFERRED EMBODIMENTS

Figure 1:
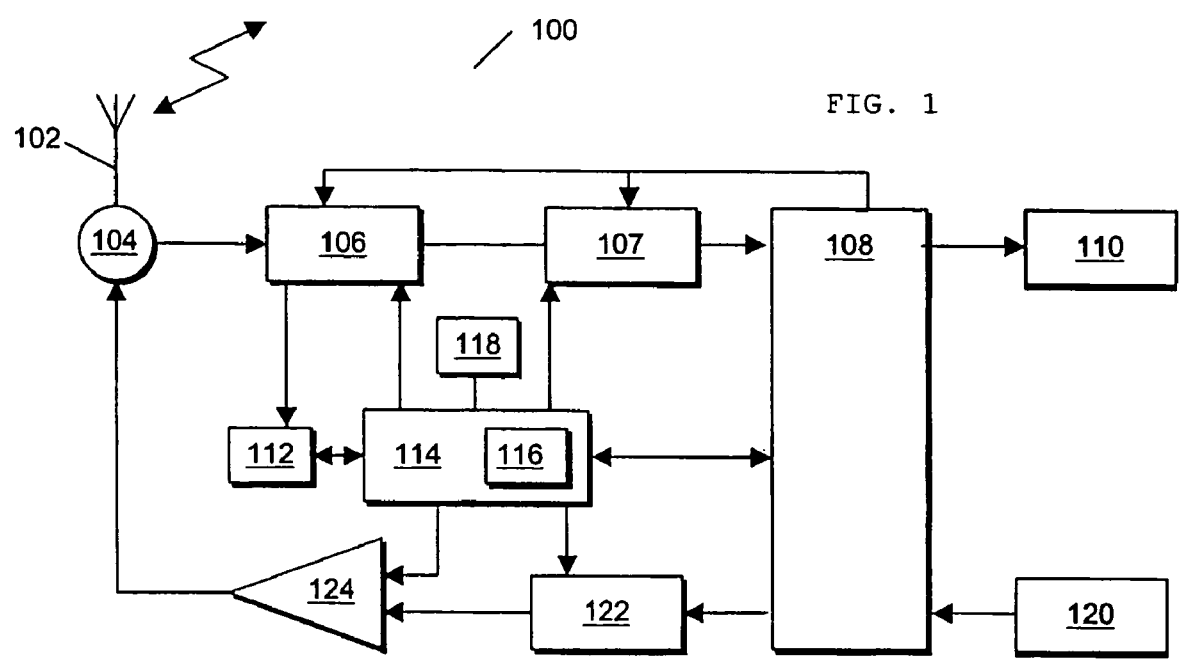
FIG. 1 shows a block diagram of a radio communication unit that can be adapted to support the various inventive concepts of the preferred embodiment of the present invention, with regard to receiver dynamic range.

Referring now to FIG. 1, a block diagram of a subscriber unit/mobile station (MS) 100, adapted to support the inventive concepts of the preferred embodiments of the present invention, is shown.

The MS 100 contains an antenna 102 preferably coupled to a duplex filter or circulator or antenna switch 104 that provides isolation between receive and transmit chains within MS 100.

The receiver chain includes scanning receiver front-end circuitry 106 (effectively providing reception, filtering and intermediate or base-band frequency conversion). The scanning front-end circuit 106 is serially coupled to a signal processing function (processor, generally realized by a DSP) 108 via a baseband (back-end) processing circuit 107. The preferred arrangement of the receiver chain is described in more detail with regard to FIG. 2.

Figure 3:
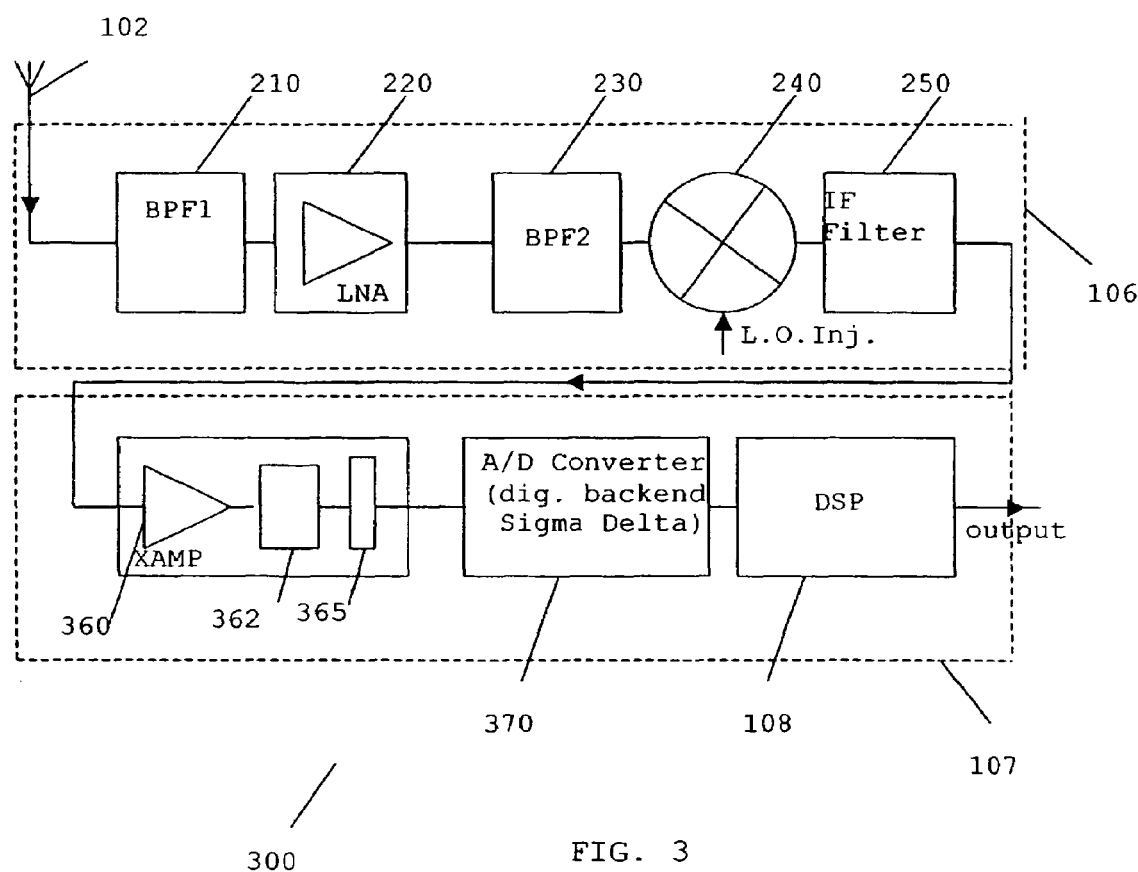
FIG. 3 shows a more detailed block-diagram representation of a receiver arrangement and method, adapted to incorporate the inventive concepts of the present invention, negating the need for an AGC circuit.

In accordance with a preferred embodiment of the present invention, the receiver chain 110 has been substantially adapted as described in more detail with regard to FIG. 3. In particular, the signal processing function 108, in conjunction with the scanning front-end circuit 106 and baseband processing circuit 107, have been adapted for a receiving MS to receive and process signals across a high dynamic range, without the need for an automatic gain control circuit.

A controller 114 is operably coupled to the scanning front-end circuitry 106 so that the receiver can calculate receive bit-error-rate (BER) or frame-error-rate (FER) or similar link-quality measurement data from recovered information via a received signal strength indication (RSSI) 112 function. The RSSI 112 function is operably coupled to the scanning front-end circuit 106. The memory device 116 stores a wide array of MS-specific data, for example decoding/encoding functions, dynamic range performance information based on 'on-channel' and 'off-channel' signal measurements obtained from, say, the RSSI function 112.

A timer 118 is operably coupled to the controller 114 to control the timing of operations, namely the transmission or reception of time-dependent signals, within the MS 100.

As known in the art, received signals that are processed by the signal processing function are typically input to an output device, such as a speaker or visual display unit (VDU).

For completeness, the transmit chain essentially includes an input device 120, such as a microphone, coupled in series through a processor 108, transmitter/modulation circuitry 122 and a power amplifier 124. The processor 108 transmitter/modulation circuitry 122 and the power amplifier 124 are operationally responsive to the controller, with an output from the power amplifier coupled to the duplex filter or circulator or antenna switch 104, as known in the art.

It is within the contemplation of the invention that the microprocessor 108 and controller arrangement 114 may be combined into one element, operably connected or separate functions of each interconnected in a reasonable manner as known in the art.

As known in the art, substantially the same circuitry of FIG. 1, (and FIG. 3) is contained within a serving communication unit/BTS, albeit with some circuits being adapted in terms of processing power, higher output power for transmission to multiple remote communication units, multiple signal paths for receiving signals from multiple remote communication units, etc. As such, when the circuitry in FIG. 1 is applied to a serving Base Transceiver Station (BTS), the serving BTS has an adapted receiver/processor arrangement to avoid the need for an AGC circuit according to the preferred embodiment of the present invention. In particular, if multiple receiver paths are used, each path no longer requires an AGC circuit or one or more AGC loops, thereby simplifying significantly the design of the BTS receiver.

In either the MS 100, or the BTS case, the signal processor function 108 in the transmit chain may be implemented as distinct from the processor in the receive chain. Alternatively, a single processor 108 may be used to implement the processing of both transmit and receive signals, as shown in FIG. 1.

Of course, the various components within the MS 100 or a similar BTS can be realized in discrete or integrated component form. Furthermore, it is within the contemplation of the invention that the MS 100 may be any radio receiver device, such as a portable or mobile PMR radio, a mobile phone, a personal digital assistant, a number of wirelessly inter-connectable laptop computers.

Figure 2:
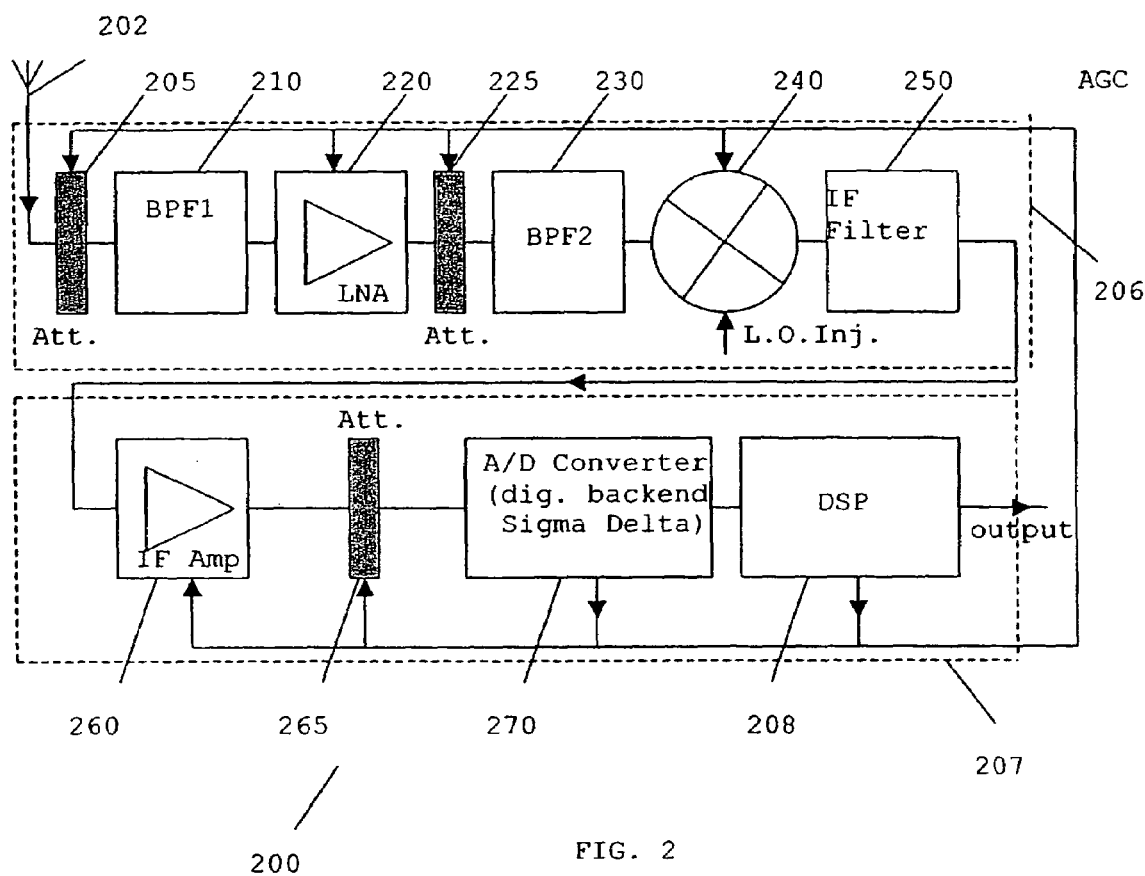
FIG. 2 shows a more detailed block-diagram representation of a prior art receiver arrangement employing automatic gain control to improve a receiver's dynamic range.

Referring now to FIG. 2, a more detailed block diagram of a prior art conventional receiver arrangement is shown, incorporating an AGC circuit to provide a receiver with high dynamic range. The receiver arrangement is suitable for receiving linear modulation signals, such as a π/4-Differential Quadrature Phase Shift Keyed (DQPSK) modulation signal in compliance with the TETRA standard.

Linear modulation technologies utilize distinct phase and/or amplitude values of signals to convey data, as known to those skilled in the art. Such data is conveyed in a format where a number of phase/amplitude positions equate to a number of bits, for example a Quadrature Phase Shift Keyed (QPSK) signal comprises four phase-shifted constellation positions, each position definable by two bits—'0, 0', '1, 0', '0, 1' and '1, 1'. The term "linear" is often used to describe such digital modulation techniques, as the received signal needs to remain in the "linear" regions of the circuits and components used to transmit or recover signals.

Consequently, linear modulation receivers do not use limiters, which are known to distort the integrity of the received signal. The integrity of received signal is judged according to the magnitude of vector errors, whereby a particular received collection of bits (2-bits in the QPSK case), is assessed in a vector context to see how far it is from the ideal case. The vector is judged in a 2-dimensional context, taking into account the amplitude and phase of the received signal.

In FIG. 2, signals enter the receiver chain via the antenna 202 and arrive at the input of a RF pre-selector band-pass filter (BPF) 210 via an adjustable RF attenuator 205. The RF filter 210 is not capable of being a narrowband (on-channel) device at such RF frequencies, but serves to reject out-of-band signals. The filtered signal is input to a low-noise pre-amplifier (LNA) 220. The LNA 220 typically has an adjustable DC current setting, which determines the dynamic range of the LNA 220.

The amplified signal leaves the LNA 220 and is input to a second RF band-pass filter 230 via a second RF attenuator 225. The second RF filter 230 further filters out-of-band interfering signals, for example image signals to which the mixer is sensitive and which would then interfere with desired signals.

The RF filtered signal is then typically input to a mixer 240, which uses a local oscillator signal to down-convert the frequency of the received signal to an intermediate frequency (IF) (or direct conversion to a baseband frequency). If a heterodyne receiver architecture is used (as shown), the intermediate frequency signal is further filtered by the IF filter 250 and input to the back-end circuit 207, where the IF signal is amplified by IF amplifier 260.

The amplified IF signal is then attenuated by IF/baseband attenuator 265 and the IF/baseband signal is then converted from an analogue signal to a digital signal, for example using sigma-delta conversion technology, as known to those skilled in the art, in A/D converter 270.

A/D converters are known to have a limited dynamic range of the order of 25 dB, which leads to the requirement of substantial AGC circuitry to ensure the input signal to the A/D converter is at an appropriate signal level. Furthermore, the A/D converter 270 includes anti-aliasing filter(s) and decimation filter(s) that assist the band-pass filtering operation of the receiver. The digital signal output from A/D converter 270 is then demodulated and processed using signal processor 208.

In operation, the signal processor 208 and/or A/D converter 270 perform the control of the dynamic range of the receiver circuit, i.e. the AGC function, by adjusting any number of components such as RF attenuators 205, 225, LNA 220, mixer 240, IF/baseband amplifier 260 or IF/baseband attenuator 265. Clearly, the more components and/or circuits used in the AGC function, the greater the number of AGC 'loops' and the greater the chance of instability. In a typical receiver, attenuator blocks are implemented using switchable attenuators or linear AGC functionality, which are accurate and easy to control, but are costly and require a large amount of space.

If a very strong signal, or a very weak signal, appears at the input of the LNA 220, the signal processor 208 and/or A/D converter 270 adjust the performance of one or more of the above components to ensure that the subsequent processing of the received signal does not distort or affect its integrity. In this manner, the signal processor 208 and/or A/D converter 270, ensures the receiver operates over a wide dynamic range. In particular, the signal processor 208 and/or A/D converter 270 prevent the desired or an interfering signal from over-loading the receiver, thereby avoiding loss of gain and/or distortion of the wanted signal.

Referring now to FIG. 3, a more detailed block-diagram representation of a receiver arrangement and method is shown, in accordance with the preferred embodiments of the present invention. Of particular note is the lack of an AGC circuit and AGC components when compared to prior art receiver arrangements, such as that described with reference to FIG. 2.

In the same manner to known radio frequency receivers, signals enter the receiver chain via the antenna 102 and arrive at the input of a RF pre-selector band-pass filter (BPF) 210. The RF filter 210 output signal is input to a low-noise pre-amplifier (LNA) 220. The LNA 220 may include an adjustable DC current setting, which would help to determine the dynamic range of the LNA 220. Alternatively, as a consequence of the inventive concepts herein described, the LNA 220 controlling voltage/current values may be fixed.

The amplified signal leaves the LNA 220 and is input to a second RF band-pass filter 230. The second RF filter 230 further filters out-of-band interfering signals, for example image signals generated during the LNA amplification process.

The RF filtered signal is again typically input to a mixer 240, which uses a local oscillator signal to down-convert the frequency of the received signal to an intermediate frequency (IF) (or direct conversion to a baseband frequency). If a heterodyne receiver architecture is used (as shown), the intermediate frequency signal is further filtered by the IF filter 250 and input to the back-end circuit 107.

In the preferred embodiment of the present invention, the back-end circuit 107 includes a modified IF/baseband amplifier (XAmp) 360.

The preferred equation is $$GXAmp = GIFamp + |LCP - ADCP| + ADCPM \qquad [1]$$

where:
  GXAmp=Gain of XAmp in dB;
  GIFamp=Gain of IF Amplifier 260 (of FIG. 2);
  LCP=Dynamic compressor clip point;
  ADCP=A/D clip point; and
  ADCPM=additional Margin to A/D clip point.

As shown above, the modified IF/baseband amplifier (XAmp) 360 amplifies the IF filtered signal with a higher gain than with a typical known prior art IF amplifier. The output of the XAmp 360 is connected to the input of the dynamic compressor function 362.

In the preferred embodiment of the present invention, the dynamic compressor function 362 may take the form of a simple 'limiter' stage. Preferably, band-pass filtering is also used within the dynamic compressor function 362 to remove any signal harmonics.

The output of the dynamic compressor function 362 is input to a modified IF/baseband attenuator function 365. The modified IF/baseband attenuator function 365 is connected to the A/D, for example digital backed Sigma Delta converter 370, and attenuates the received signal level to a sufficient level to prevent it from clipping in the A/D.

It is noteworthy that the modified IF/baseband attenuator function 365 is fixed, whose value is calculated as:

$$\text{Attenuation } [dB] = |LCP - ADCP| + ADCPM \quad [2]$$

The digital signal output from A/D converter 270 is then demodulated and processed using microprocessor 108.

In accordance with the preferred embodiment of the present invention, the introduction of a higher and specific gain IF/baseband amplifier 360, together with the dynamic compressor 362 has enabled the operation of the A/D converter 270 and/or microprocessor 108 to be adapted such that they no longer need to support an AGC function.

The preferred embodiment of the present invention is particularly applicable to TETRA π/4-DQPSK modulated signals. However, it is within the contemplation of the invention, that the inventive concepts herein described will also work with many other linear modulation schemes.

Furthermore, the inventor of the present invention has found that there is negligible impact in vector-error magnitude when implementing the dynamic compressor together with the modified XAmp 360. In addition, the use of the dynamic compressor avoids the possibility of a high received signal exceeding the clip point of the sigma-delta A/D converter 370.

Notwithstanding the above removal of all AGC circuits and components in the preferred embodiment of the invention, it is within the contemplation of the invention that minimal AGC may be employed. One example would be in providing AGC performance of the order of 10 db or 20 dB, which may be available as a standard offering in integrated digital backed ICs. Although AGC is no longer required, such levels are typically provided for in sigma-delta A/D converters and may therefore be of some use in fine-tuning received signal levels.

In implementing the receiver arrangement of FIG. 3, an operational dynamic range of 130 dB or more can be achieved without any AGC or, if used, with only 10 dB to 20 dB of AGC in the A/D (digital backed Sigma Delta) converter 370. With this approach a TETRA bit error rate of zero failures can be achieved for signals up to +16 dBm or more whilst meeting all receiver specifications. Advantageously, the above receiver arrangement eliminates the many disadvantages of conventional linear receivers requiring AGC circuits, and other (non-linear) receivers that require a more complex wide-band AGC operation, as previously described.

It is further within the contemplation of the invention that alternative receiver architectures can be used that would also benefit from the inventive concepts described herein, such as direct conversion receivers, superheterodyne receivers etc.

Thus, a wireless communication unit incorporating a receiver has been described. The receiver includes radio frequency circuitry for receiving a radio frequency signal and converting said radio frequency signal to a low frequency signal. A signal level adjustment circuit receives said low frequency signal; and an analogue to digital converter, operably coupled to said signal level adjustment circuit, receives an adjusted low frequency signal and provides a digital received signal. A signal processor is operably coupled to the analogue to digital converter for processing said digital received signal. The signal level adjustment circuit includes a low (or intermediate) frequency amplifier whose gain is arranged to be dependent upon a clip point of said analogue to digital converter.

In this manner, AGC circuits and components are not required, particularly in relation to a digital receiver compliant with the TETRA standard.

Whilst specific, and preferred, implementations of the present invention are described above, it is clear that one skilled in the art could readily apply variations and modifications of such inventive concepts.

The invention claimed is:

1. A wireless communication unit incorporating a receiver, the receiver comprising:
   radio frequency circuitry for receiving a radio frequency signal and converting said radio frequency signal to a low frequency signal;
   a signal level adjustment circuit for receiving said low frequency signal;
   an analogue to digital converter, operably coupled to said signal level adjustment circuit for receiving an adjusted low frequency signal and providing a digital received signal; and
   a signal processor operably coupled to the analogue to digital converter for processing said digital received signal;
   wherein said signal level adjustment circuit comprises a low frequency amplifier having a gain, a dynamic compressor function, operably coupled to said low frequency amplifier for limiting a signal output from said low frequency amplifier, and a fixed attenuator operably coupled to said dynamic compressor function to attenuate at a fixed attenuation level a received signal output from said dynamic compressor function to below a clip point threshold of said analogue to digital converter, wherein the gain of the low frequency amplifier is arranged to be dependent upon a clip point of said dynamic compressor function subtracted by a clip point of said analogue to digital converter.

2. The wireless communication unit according to claim 1, wherein said fixed attenuator is arranged to be dependent upon a clip point of said analogue to digital converter.

3. The wireless communication unit according to claim 2, wherein said fixed attenuator is arranged to be dependent upon a clip point of said dynamic compressor function.

4. The wireless communication unit according to claim 3, wherein said fixed attenuator is arranged to be dependent upon the clip point of said dynamic compressor function subtracted by the clip point of said analogue to digital converter.

5. The wireless communication unit according to claim 1, wherein said fixed attenuator is arranged to be dependent upon a clip point of said dynamic compressor function.

6. The wireless communication unit according to claim 1, wherein said low frequency components are at an intermediate or baseband frequency.

7. The wireless communication unit according to claim 1, wherein said receiver has a high dynamic range, for example in excess of 100 dB.

8. The wireless communication unit according to claim 1, wherein said signal level adjustment circuit negates a need for an automatic gain control circuit.

9. The wireless communication unit according to claim 1, wherein the wireless communication unit is a subscriber unit or a base transceiver station operating in a wireless communication system.

10. The wireless communication unit according to claim 9 wherein the subscriber unit is one of a portable or mobile PMR radio, a mobile phone, a personal digital assistant, a wireless capable laptop computer.

11. The wireless communication unit according to claim 1, wherein the received signal is a digitally modulated signal.

12. The wireless communication unit according to claim 11, wherein the receiver is a linear receiver for receiving said digitally modulated signal.

13. A method of signal reception for a wireless communication unit, the method comprising:
   receiving a radio frequency signal and converting said radio frequency signal to a low frequency signal;
   adjusting the signal level of said low frequency signal;
   analogue to digital converting the signal with an analogue to digital converter after said signal level adjustment step, thereby providing a digital received signal; and
   signal processing of the said digital received signal;
   wherein said adjusting the signal level comprises low frequency amplification with a gain, limiting a signal output from the low frequency amplification using a dynamic compressor function, and attenuating at a fixed attenuation level a signal output from the dynamic compressor function to below a clip point threshold of the analogue to digital converter, using a fixed attenuator, wherein the gain of the low frequency amplification is arranged to be dependent upon a clip point of said dynamic compressor function subtracted by a clip point of said analogue to digital converter.

* * * * *